(12) United States Patent
Lai

(10) Patent No.: US 8,294,604 B2
(45) Date of Patent: Oct. 23, 2012

(54) TEST SYSTEM AND METHOD FOR ANALOG-TO-DIGITAL CONVERTER

(75) Inventor: Tsung-Yu Lai, Taichung (TW)

(73) Assignee: Faraday Technology Corp., Science-Based Industrial Park, Hsin-Chu (TW)

(*) Notice: Subject to any disclaimer, the term of this patent is extended or adjusted under 35 U.S.C. 154(b) by 88 days.

(21) Appl. No.: 13/071,138

(22) Filed: Mar. 24, 2011

(65) Prior Publication Data

US 2011/0241914 A1    Oct. 6, 2011

(30) Foreign Application Priority Data

Apr. 2, 2010   (TW) ............................... 99110394 A

(51) Int. Cl.
*H03M 1/10* (2006.01)

(52) U.S. Cl. ........ 341/120; 324/500; 324/524; 324/548; 324/555; 714/738; 375/224; 375/295; 704/502; 704/E19.009; 381/63; 455/115.2; 455/67.13

(58) Field of Classification Search .................. 341/120, 341/155; 455/67.111, 115.2, 67.13, 67.14; 702/107; 704/502, E19.009; 381/63; 375/224, 375/295, 296; 714/738; 324/500, 525, 548, 324/555
See application file for complete search history.

(56) References Cited

U.S. PATENT DOCUMENTS

| | | | | |
|---|---|---|---|---|
| 5,659,312 A * | 8/1997 | Sunter et al. | .................. | 341/120 |
| 5,893,067 A * | 4/1999 | Bender et al. | .................. | 704/502 |
| 6,100,828 A | 8/2000 | Sparks | | |
| 6,492,923 B1 * | 12/2002 | Inoue et al. | ................... | 341/120 |
| 6,566,857 B1 * | 5/2003 | Kakizawa et al. | ............. | 324/120 |
| 6,919,833 B2 * | 7/2005 | Mills | .............................. | 341/144 |
| 7,343,538 B2 * | 3/2008 | Ricca et al. | .................... | 714/740 |
| 7,369,813 B2 * | 5/2008 | Andersson | ................. | 455/67.11 |
| 7,405,681 B2 * | 7/2008 | Jonsson et al. | ................ | 341/120 |
| 7,683,630 B2 * | 3/2010 | Almonte | ....................... | 324/548 |
| 7,737,718 B2 * | 6/2010 | Koura | ...................... | 324/762.01 |
| 7,952,396 B1 * | 5/2011 | Hunter et al. | ................. | 327/106 |
| 7,957,460 B2 * | 6/2011 | Van Den Brink et al. | .... | 375/224 |
| 8,193,817 B2 * | 6/2012 | Meagher et al. | ............. | 324/525 |

* cited by examiner

*Primary Examiner* — Lam T Mai
(74) *Attorney, Agent, or Firm* — Winston Hsu; Scott Margo

(57) ABSTRACT

Test system and method for analog-to-digital converter (ADC) based on a loopback architecture are provided to test an M-bit ADC. In the invention, an N-bit digital-to-analog converter (DAC) converts a digital input to a basic test signal, a segmentation circuit scales the basic test signal and superposes it with segmentation DC levels for providing corresponding segmented test signals, such that the ADC converts the segmented test signals to reflect result of testing. With the invention, practical loopback architecture of low-cost can be adopted for testing.

10 Claims, 6 Drawing Sheets

TEST SYSTEM AND METHOD FOR ANALOG-TO-DIGITAL CONVERTER

This application claims the benefit of Taiwan application Serial No. 99110394, filed Apr. 2, 2010, the subject matter of which is incorporated herein by reference.

FIELD OF THE INVENTION

The present invention relates to a test system and a test method for an ADC (analog-to-digital converter), and more particularly to a test system and a test method adopting segmentation test with a loopback architecture of an N-bit DAC (digital-to-analog converter) to an M-bit ADC.

BACKGROUND OF THE INVENTION

Various signal circuits are common building blocks of modern integrated circuits. For example, signal circuits like ADCs and DACs performing conversions between analog signals and digital signals are often integrated into a same chip/integrated circuit for, e.g., capturing and digitizing analog video, audio and/or sensing signals, and generating analog video, audio and/or driving outputs of digital signals.

SUMMARY OF THE INVENTION

As ADCs become commonly used building blocks in modern integrated circuits, how to test their functions is an important issue.

In an embodiment, a DAC is utilized with an ADC under test to form a loopback architecture for test. The DAC converts a digital input of test codes to an analog test signal, and the ADC under test converts the analog test signal to a corresponding digital output. By analyzing/comparing the digital output of the ADC according to the digital input of the test code, function and performance of the ADC can be understood.

However, while implementing the aforementioned embodiment with a peak-to-peak output range of the DAC equal to rated input range of the ADC, a resolution of the DAC has to be better than the ADC under test. That is, in such embodiment, if the DAC is an N-bit DAC converting digital input of N-bit to analog output, and the ADC is an M-bit ADC converting analog input to digital output of M-bit, then N has to be greater than M to clearly reflect true test results. While testing with such embodiment, if N equals M or is less than M, some test codes of adjacent values in the digital input will be mapped to values no longer adjacent in the digital output by the loopback architecture, even when the ADC functions normally; such scenario will be erroneously interpreted as missing code of the ADC. Therefore, in a typical example of such embodiment, a 12-bit DAC of higher cost is adopted for correct test of a 10-bit ADC.

Therefore, the invention aims to provide a practical test system and method of low cost for testing functions and performances of an ADC.

In the test system according to an embodiment of the invention, the ADC is tested through a loopback architecture. In addition to the ADC under test, the loopback architecture includes a segmentation circuit and an associated DAC. The DAC, as an analog signal circuit, converts a digital input of test codes to an analog basic test signal. The segmentation circuit scales amplitude of the basic test signal and superposes it with a segmentation DC level to generate a corresponding segmentation test signal, such that the test system of the invention can reflect test result of the ADC according to conversion of the segmentation test signal performed by the ADC.

In an embodiment of the invention, the segmentation circuit scales a peak-to-peak range of the basic test signal according to a scaling ration 1/L, so the peak-to-peak range of the scaled basic test signal is less than that of the original basic test signal; furthermore, the segmentation circuit sequentially superposes a plurality of different segmentation DC levels to the scaled basic test signal to respectively provide a plurality of segmentation test signals, wherein signal swing ranges of at least two of the segmentation signals partially overlap. Operation of the segmentation circuit equivalently increases resolution of the basic test signal to achieve correct test.

To be more precisely, assuming the segmentation circuit sequentially provides K (a constant greater than 1) segmentation test signals, the scaling ratio 1/L by which the segmentation circuit scales the basic test signal can be determined according to K. While scaling the basic test signal, the segmentation circuit further superposes K different segmentation DC levels to the basic test signal to form K segmentation test signals, respectively. Setting of the scaling ratio and the segmentation DC levels are arranged such that the swing ranges of the K segmentation test signals are different but partially overlap in pairs, and a union of the swing ranges of all the K segmentation test signals can cover the peak-to-peak range of the basic test signal before scaling. For example, as resolution allows, a 10-bit DAC and a segmentation circuit with segmentation of two (K=2) or three (K=3) can be adopted to test a 10-bit ADC.

In an embodiment of the invention, the segmentation circuit includes a scaling resistor network, a level adjusting resistor network and an operation amplifier. The scaling resistor network includes two resistors, and the scaling ratio can be set according to the two resistors. The level adjusting resistor network includes a variable resistor, and the segmentation DC level is adjusted according to resistance of the variable resistor. The operation amplifier includes two input nodes respectively coupled to the scaling resistor network and the level adjusting resistor network, so the operation amplifier outputs the segmentation test signals. The scaling resistor network and the operation amplifier combine to form a scaling circuit coupled to the analog signal circuit for scaling the basic test signal. The level adjust resistor network and the operation amplifier combine to form a level superposing circuit coupled between the scaling circuit and the ADC for superposing the segmentation DC levels to the scaled basic test signal to generate the segmentation test signals.

Another respect of the invention is providing a test method testing ADC with aforementioned loopback architecture.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
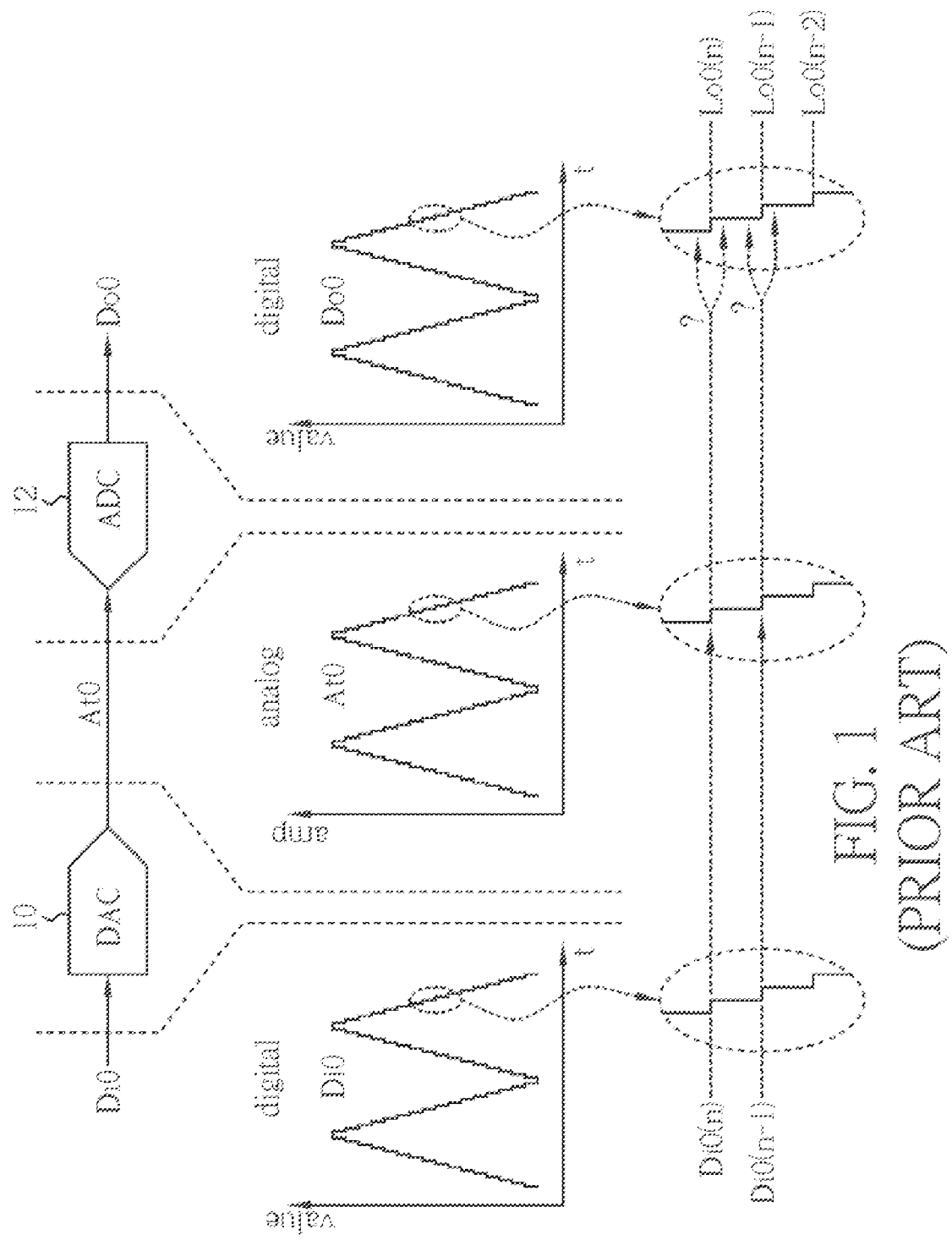
FIG. 1 and FIG. 2 illustrate an embodiment of a loopback architecture.
Figure 2:
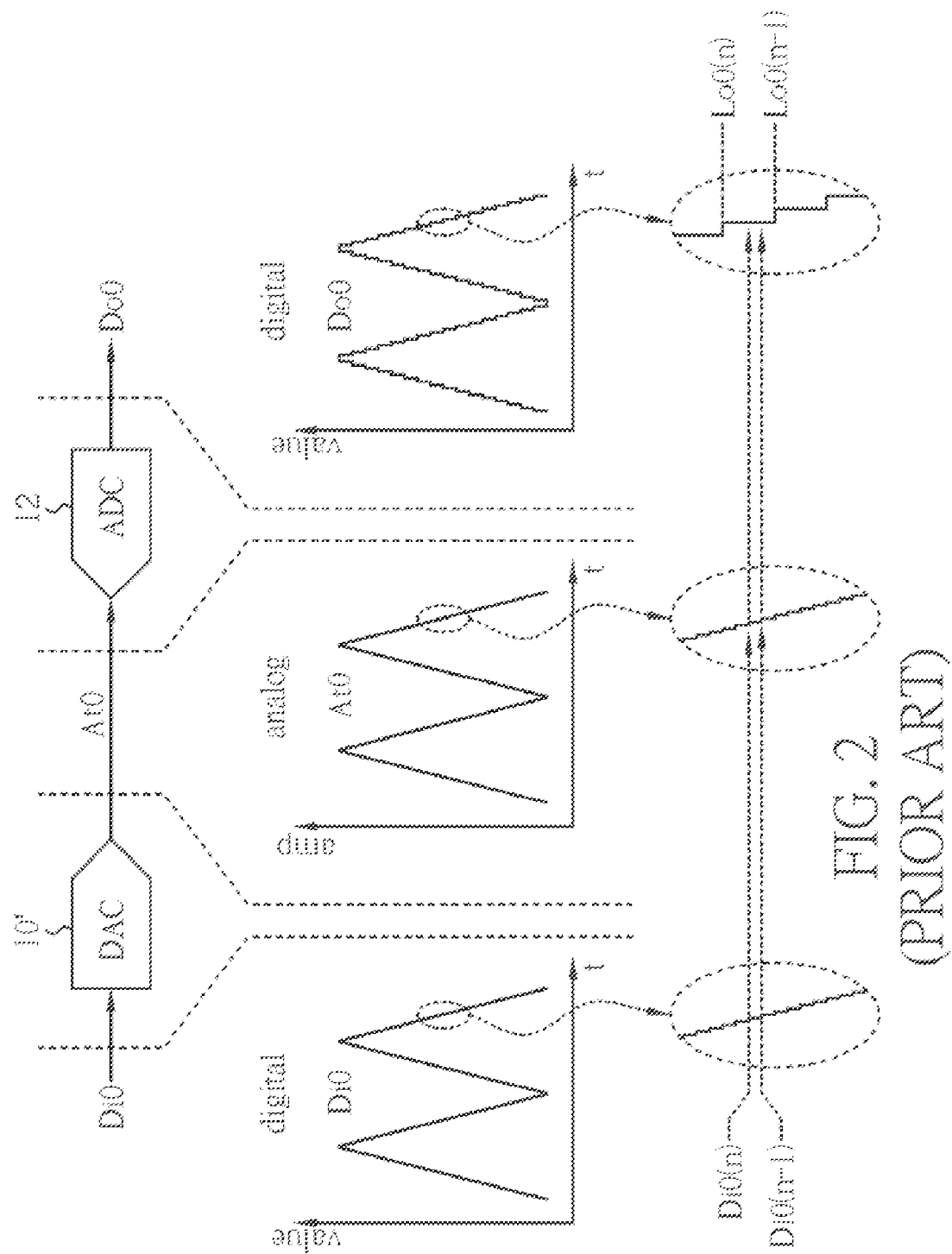

Please refer to FIG. 1 and FIG. 2 illustrating an embodiment of a loopback architecture formed by a DAC and an ADC for test of the ADC. In FIG. 1, an ADC 12 is tested with a DAC 10 of equal bits. For DAC, quantity of bits of digital input is one of the representative characteristics of DAC. For example, a 10-bit DAC converts 10-bit digital input to corresponding analog output; i.e., amplitude of the analog output has 1024 (2 to the 10th power) variations. Similarly, quantity of bits of ADC's digital output is one characteristics of ADC. For example, a 10-bit ADC quantizes/converts an analog input to a corresponding 10-bit digital output according to 1024 quantization steps. In FIG. 1, DAC 10 and ADC 12 of the same quantities of bits form the loopback architecture; for convenience of discussion, it is assumed that the DAC 10 and the ADC 12 are both 10-bit, and a peak-to-peak output range of the DAC 10 equals a rated input range of the ADC 12.

While testing with the loop architecture of FIG. 1, a digital input Di0 of periodic test codes of continuously changing values is fed to the DAC 10. For example, in association with the 10-bit DAC 10, the test codes in the digital input Di0 periodically increase from 0, 1, 2 . . . to 1023 and decrease from 1023, 1022 . . . to 0. As the waveform timing diagram shows in FIG. 1, a waveform of the digital input Di0 (with the transverse axis being time labeled by "t" and the longitudinal axis being digital value labeled by "value") shows periodic stair-up and stair-down due to periodically increasing and decreasing test codes.

As the digital input Di0 is received, the DAC 10 converts it to a corresponding analog test signal At0. FIG. 1 also illustrates waveform of the test signal At0 with transverse axis of time and longitudinal axis of analog signal amplitude (labeled by "amp" in the figure).

In the loopback architecture of FIG. 1, the analog test signal At0 provided by the DAC 10 is directly transmitted to the ADC 12, and the ADC 12 converts it to a corresponding digital output Do0. By analyzing the digital output Do0, whether conversion function and performance of the ADC 12 match expectation is tested.

However, because DAC and ADC of equal quantities of bits are adopted to form the loopback architecture of FIG. 1, test codes of adjacent values in the digital input will be mapped to values no longer adjacent in the digital output by the loopback architecture even when the ADC operates correctly; and this will be erroneously interpreted as missing code of the ADC.

As shown in FIG. 1, because conversion bits of digital-to-analog and analog-to-digital are equal, when two test codes Di0($n-1$) and Di0($n$) of adjacent values are converted to the analog test signal At0, the ADC 12 quantizes the test signal At0 according to adjacent quantization steps Lo0($n-1$) and Lo0($n$). During quantization, however, the test code Di0($n-1$) may be mapped to quantization step Lo0($n-2$) or Lo0($n-1$) due to noise or minor circuit operation error; similarly, the test code Di0($n$) may be mapped to quantization step Lo0($n$) or a higher quantization step. Such uncertainty leads to incorrect interpretation of test result. For example, if the test code Di0($n-1$) is mapped to quantization step Lo0($n-2$) and the test code Di0($n$) is mapped to quantization step Lo0($n$), then value corresponding to quantization step Lo0($n-1$) in the digital output Do0 of the ADC 12 will disappear. Because the digital input Di0 changes values continuously, if the digital output Do0 loses value of quantization step Lo0($n-1$), it is interpreted as: missing code happens in the ADC 12. Actually, the ADC 12 does not malfunction; the test result fails to correctly reflect true operation of the ADC 12 due to improper configuration of the loopback architecture.

For a correct test with the loopback architecture of FIG. 1, resolution of the DAC 10 should be higher than that of the ADC 12. Please refer to FIG. 2 for such embodiment. In the loopback architecture of FIG. 2, a DAC 10' of greater quantity of bits is adopted for test of the ADC 12 of less quantity of bits. For example, a 12 bit DAC 10' is used to form the loopback architecture with the 10-bit ADC 12.

While testing, in association to the 12-bit DAC 12', test codes in the digital input Di0 periodically increases from 0, 1 . . . to 4095 and decreases from 4095, 4094 . . . to 0. The DAC 10' converts the digital input Di0 to the analog test signal At0, so the ADC 12 converts it to the digital output Do0. As waveform timing diagrams in FIG. 2 illustrate, since the digital input Di0 is of greater bits, a difference between adjacent test codes Di0($n-1$) and Di0($n$) is smaller than that between adjacent quantization steps Lo0($n-1$) and Lo0($n$), such that each quantization step of the ADC 12 is sure to correspond to at least a test code. In fact, each quantization step has multiple corresponding test codes; a quantization step corresponds to fewer or more test codes due to factors like noise. For example, quantization step Lo0($n$) may correspond to five adjacent test codes, and quantization step Lo0($n-1$) may correspond to three adjacent test codes. As each quantization step corresponds to at least a test code, erroneous missing code interpretation due to incorrect resolution configuration can be avoided, and the test result can precisely reflect actual operation of the ADC 12.

However, the embodiment of FIG. 2 suffers from higher cost, larger layout, more power consumption and required system resources since the loopback architecture is formed with DAC of higher bits.

Figure 3:
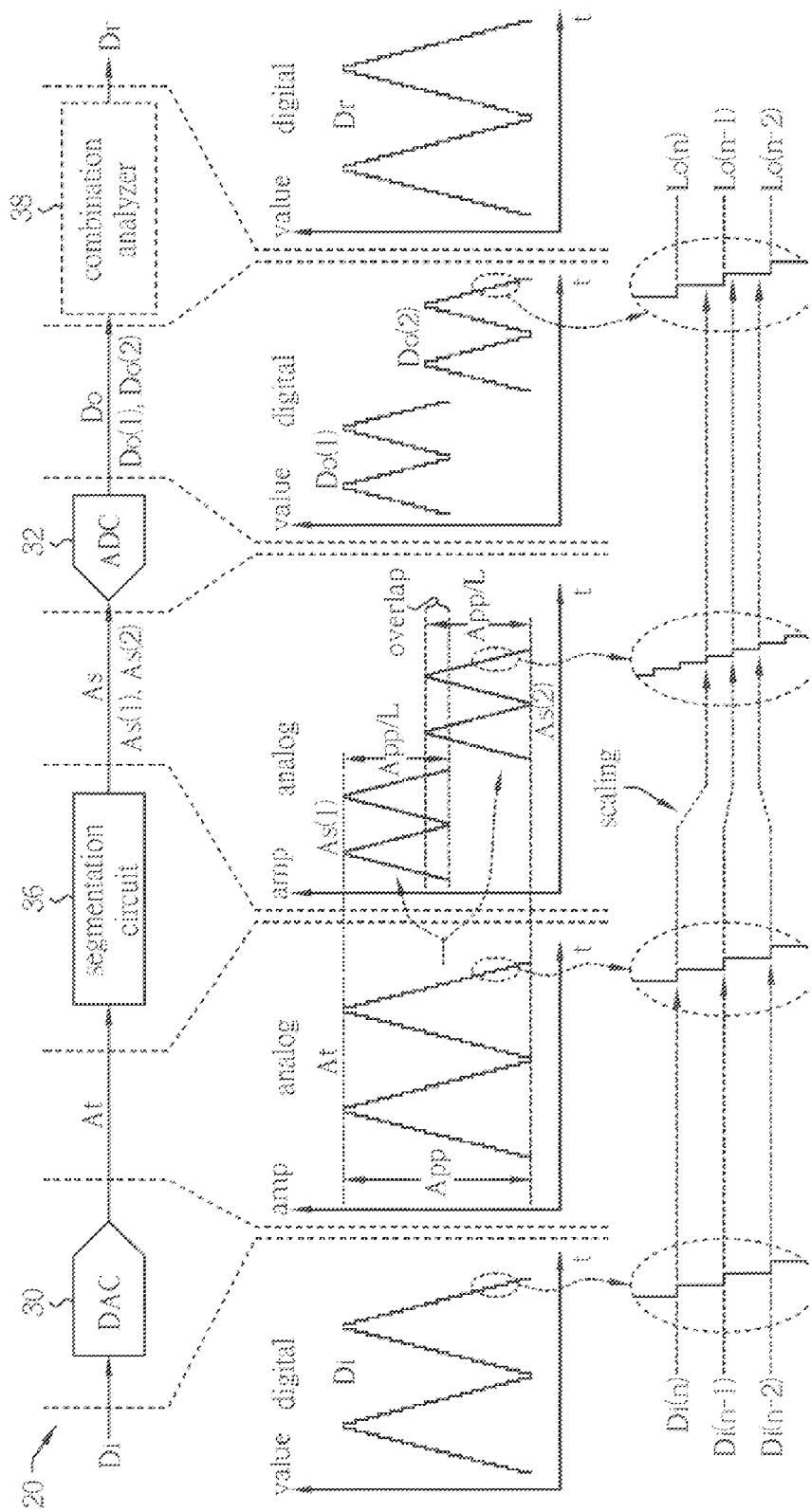
FIG. 3 illustrates a test system and its operation according to an embodiment of the invention.

To address disadvantages of the embodiment shown in FIG. 1 and FIG. 2, segmentation technique is adopted in the invention for improvement of loopback architecture. Please refer to FIG. 3 illustrating a test system 20 according to an embodiment of the invention. Generally speaking, chips/integrated circuits for signal processing are integrated/embedded with DAC and ADC; then the loopback architecture for testing ADC can be formed with the embedded DAC and ADC. In the test system 20, a DAC 30, an ADC 32 and a segmentation circuit 36 coupled between them form the loopback architecture.

During test, the DAC 30 works as an analog signal circuit converting the digital input Di of test codes to an analog basic test signal At. The segmentation circuit 36 scales amplitude of the basic test signal At and superposes a segmentation DC level to it to generate a corresponding segmentation test signal As. According to conversion of the segmentation test signal As performed by the ADC 32, the test system 20 reflects test result of the ADC 32.

In FIG. 3, example of equal quantities of bits is considered to illustrate operation of the system 20, e.g., 10-bit DAC 30 is used for testing 10-bit ADC. For convenience of discussion, it is assumed that an output peak-to-peak range of the DAC 30 equals a rated input range of the ADC 32.

As shown by waveform timing diagrams of FIG. 3, during test, in association to the 10-bit DAC 30, the digital input Di of test codes periodically changing (increasing/decreasing) between 0 and 1023 is inputted to the DAC 30, and the DAC 30 converts the digital input Di to the basic test signal At with a peak-to-peak range (amplitude difference between signal maximum and minimum) App.

The basic test signal At is transmitted to the segmentation circuit 36. According to a scaling ratio 1/L, the segmentation circuit 36 scales the peak-to-peak range of the basic test signal At, such that the scaled peak-to-peak range App/L is smaller than the original (not scaled) peak-to-peak range App; in addition, several (two in FIG. 3) different segmentation DC levels are superposed to the scaled basic test signal At to respectively provide corresponding segmentation test signals As(1) and As(2), wherein signal swing ranges of the segmentation test signals As(1) and As(2) partially overlap (as labeled in FIG. 3), and a union of the two swing ranges covers the original peak-to-peak range App of the basic test signal At, as shown in waveforms of FIG. 3.

The analog segmentation test signals As(1) and As(2) can be viewed as different portions of the segmentation test signal As. The ADC 32 receives the segmentation test signals As(1) and As(2) and respectively coverts them to digital outputs Do(1) and Do(2) (as different portions of a digital input Do). With operation of a combination analyzer 38, the digital outputs Do(1) and Do(2) are combined to form a digital combined output Dr. According to the combined output Dr, function and operation of the ADC 32 can be analyzed/judged/tested. Partial overlap is designed for combination convenience as the combination analyzer 38 combines the digital outputs Do(1) and Do(2) to form the combined output Dr. Because the swing ranges of the segmentation test signals As(1) and As(2) partially overlap, codes of equal values appear in both digital outputs Do(1) and Do(2). Then the combination analyzer 38 combines the digital outputs Do(1) and Do(2) to form the digital combined output Dr according to these codes of equal values.

Waveform timing diagrams of FIG. 3 further illustrate operation principle of the invention. In the digital input Di, adjacent test codes Di(n−2) to Di(n) are converted to different analog amplitudes of the basic test signal At; these amplitude differences are scaled to 1/L by the segmentation circuit 36 and are reflected in the segmentation test signals As(1) and As(2), since the segmentation circuit 36 scales the basic test At to form the segmentation test signals As(1) and As(2) with the scaling ratio 1/L. In this way, even the quantization step resolution of the ADC 32 (e.g., difference between quantization steps Lo(n−1) and Lo(n)) is the same as the resolution of the digital input Di (e.g., difference between the test codes Di(n−1) and Di(n)), a quantization step will have at least one corresponding test code when the ADC 32 converts the segmentation signals As(1) and As(2) to the digital inputs Do(1) and Do(2), similar to effect of the example shown in FIG. 2. In other words, segmentation and scaling of the segmentation circuit 36 can equivalently enhance resolution of the basic test signal At; even the DAC 30 and the ADC 32 are of the same bits, the invention can avoid erroneous report of missing code under loopback architecture and thus achieve correct test.

Figure 4:
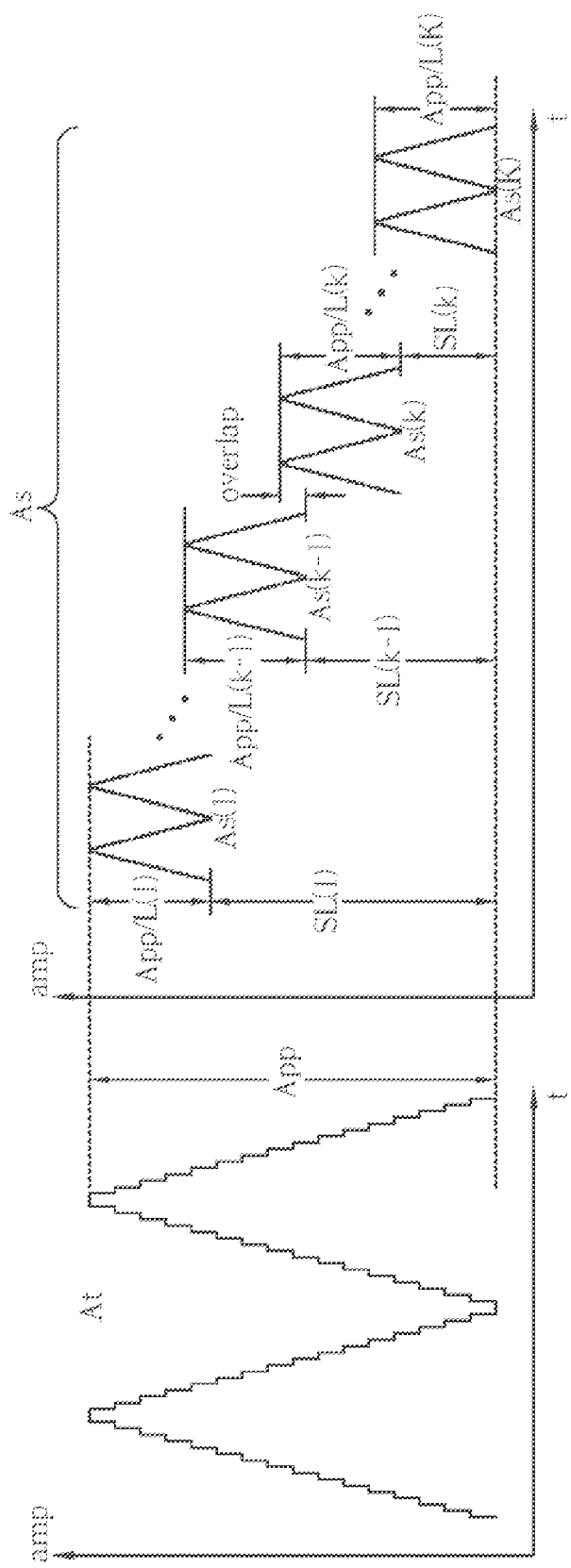
FIG. 4 generalizes operation of the segmentation circuit of FIG. 3.

Operation of the segmentation circuit 36 can be generalized to FIG. 4. In a loopback architecture of N-bit DAC 30 and M-bit ADC 32, the segmentation circuit 36 sequentially provides K (a constant greater than 1) segmentation test signals As(1) to As(K) according to the basic test signal At provided by the DAC 30. For the k-th (k=1 to K) segmentation test signal As(k), the segmentation circuit 36 scales the basic test signal At with a scaling ratio 1/L(k), and K different segmentation DC levels of levels SL(1) to SL(K) are respectively superposed to the scaled basic test signal to form the K segmentation test signal As(1) to As(K). For example, if the peak-to-peak range of the basic test signal At is App, then the peak-to-peak range of the segmentation test signal As(k) is changed to App/L(k) by scaling of the segmentation circuit 36; moreover, the swing range of the segmentation test signal As(k) is shifted by the level SL(k), so the signal swing range of segmentation test signal As(k) can be defined by the range from SL(k) to SL(k)+App/L(k). Because the DC levels SL(k−1) and SL(k) respectively corresponding to the segmentation test signals As(k−1) and As(k) are different, the swing ranges of the segmentation signals As(k−1) and As(k) are different.

While setting the aforementioned segmentation circuit, the scaling ration 1/L(k) and the level SL(k) are designed so that swing ranges of the adjacent segmentation test signals As(k−1) and As(k) partially overlap, and union of the swing ranges of all the segmentation test signals As(1) to As(K) covers the swing range of the original (not scaled) basic test signal. It is emphasized that the scaling ration 1/L(k) can vary with k, i.e., different segmentation test signal As(k) corresponds to different scaling ratio 1/L(k), and the scaling ration 1/L(k) can be greater or less than 1.

Figure 5:
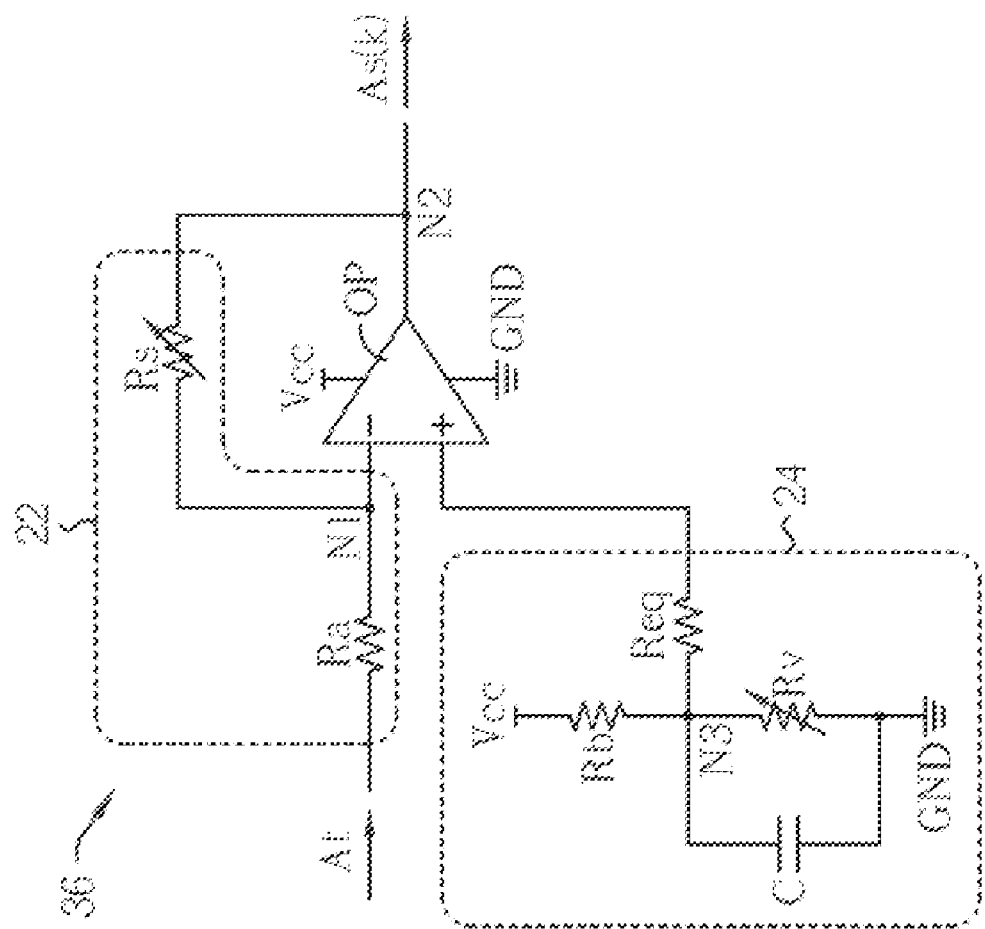
FIG. 5 illustrates the segmentation circuit of FIG. 3 according to an embodiment of the invention.

Following the embodiment of FIG. 3 and FIG. 4, please refer to FIG. 5 illustrating an embodiment of the segmentation circuit 36. The segmentation circuit 36 works between DC power voltage Vcc and ground voltage GND, and includes a scaling resistor network 22, a level adjusting resistor network 24 and an operation amplifier OP. The scaling resistor network 22 includes two resistors Ra and Rs; the resistor Ra has one terminal coupled to a node N1 and the other terminal receiving the analog basic test signal At, and the resistor Rs is coupled between nodes N1 and N2. The operation amplifier OP has two input nodes (labeled by "+" and "−" in FIG. 5) and an output node at the node N2 outputting the segmentation test signal As(k) of the segmentation circuit 36. The level adjusting resistor network 24 includes resistors Req, Rb, Rv and a capacitor C; the resistor Req has one terminal coupled to one of the input nodes of the operation amplifier OP, and the other terminal coupled to the node N3. The resistor Rb is coupled between the power voltage Vcc and the node N3; the resistor Rv and the capacitor C are coupled between the node N3 and the ground voltage GND.

In the segmentation circuit 36, the scaling resistor network 22 and the operation amplifier OP combine to form a scaling circuit scaling the basic test signal At; the level adjusting resistor network 24 and the operation amplifier OP combines to be a level superposing circuit superposing the segmentation DC level to the scaled basic test signal to provide each segmentation test signal As(k). The scaling ration 1/L can be set with resistance of the resistors Ra and Rs; actually, resistance ratio of the resistors Ra and Rs determines the scaling ratio 1/L. Therefore, the resistor Rs can be a variable resistor to adjust the scaling ratio 1/L by changing its resistance. In the level adjusting resistor network 24, the resistor Rv can be a variable resistor; by sequentially changing resistance of the resistor Rv, the segmentation DC level of each segmentation test signal As(k) can be adjusted, so the swing range of each segmentation test signal As(k) can be shifted to proper position. It is emphasized that FIG. 5 just shows an embodiment of the segmentation circuit 36, other equivalent circuits of equal functions can be adopted to implement the segmentation circuit 36.

Figure 6:
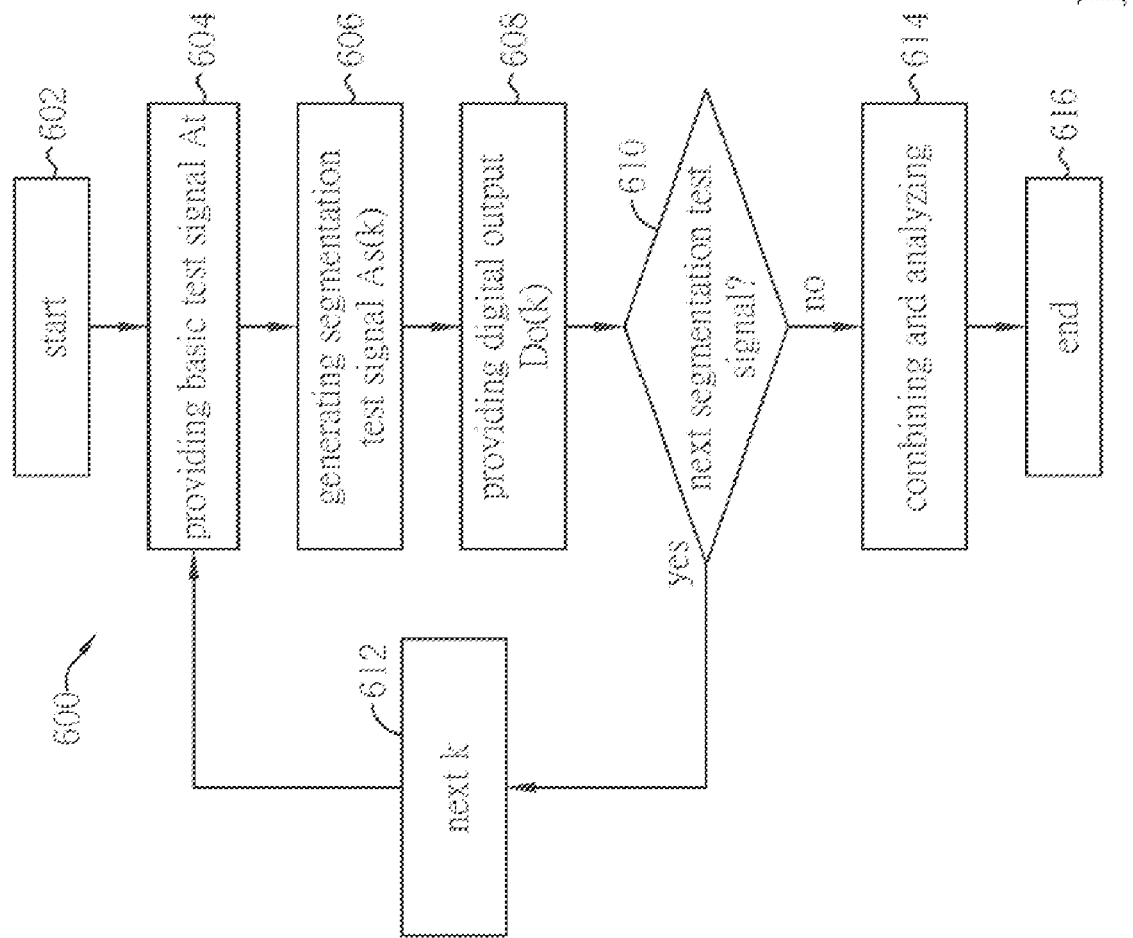
FIG. 6 illustrates flow of the test system according to an embodiment of the invention.

Following the embodiment of FIG. 3/4, test operation of the test system 20 can be explained by a flow 600 shown in FIG. 6. The flow 600 includes the following steps.

Step 602: staring test with the test system 20.

Step 604: inputting digital input of test codes to the DAC 30, such that the DAC 30 performs conversion to generate corresponding analog basic test signal At.

Step 606: scaling the basic test signal At and superposing a segmentation DC level to it to generate a corresponding test signal As(k). As previously discussed, the segmentation circuit 36 can set the scaling ratio 1/L and the segmentation DC level according to K, quantity of the segmentation test signals.

Step 608: as the segmentation signal As(k) is received, converting it to the corresponding digital output Do(k) by the ADC 32.

Step 610: determining if all K segmentation test signals are processed. If not, proceeding to step 612; otherwise, proceeding to step 614.

Step 612: updating k and recurring to steps 606 and 608 for obtaining digital output of the next segmentation test signal.

Step 614: collecting all K digital output Do(k) with the combination analyzer 38, so the functions and performances of the ADC 32 can be analyzed accordingly.

Step 616: ending the test.

In the embodiment of FIG. 3 and the flow 600, the combination analyzer 38 generally refers to integration of devices/circuits/tools for combining and analyzing test results. For example, the ADC 32 in the test system 20 can output each digital output Do(k) out of the chip/integrated circuit, so an external computer system can combine and analyze the digital outputs; under such circumstance, the combination analyzer 38 is implemented by the external computer system. Or, a portion of functions of the combination analyzer 38 can be implemented with circuit embedded in chip/integrated circuit, and other portion of functions is implemented by external device(s) such as a computer system or another chip. Moreover, the combination analyzer 38 can be integrated into chip/integrated circuit with the test system 20.

To sum up, the invention tests analog-to-digital conversion by segmentation technique of low cost in association with loopback architecture of DAC and ADC; erroneous interpretation of test result due to incorrect resolution configuration can be avoided, and test can be performed without high bits DAC of high cost, thus test cost and correctness can both be satisfied.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A test system testing an ADC with loopback architecture, comprising:
    an analog signal circuit providing an analog basic test signal; and
    a segmentation circuit scaling an amplitude of the basic test signal and superposing it with a segmentation DC level to generate a corresponding segmentation test signal, such that the test system reflects test result of the ADC according to a conversion result of the segmentation test signal performed by the ADC.

2. The test system as claimed in claim 1, wherein the analog signal circuit is a DAC converting a digital input to the analog basic test signal.

3. The test system as claimed in claim 1, wherein the segmentation circuit sequentially superposes a plurality of different segmentation DC levels to the scaled basic test signal for providing a plurality of corresponding segmentation test signals, such that the test system reflects test result of the ADC according to conversion results of the plurality of segmentation test signals performed by the ADC.

4. The test system as claimed in claim 3, wherein the segmentation circuit provides the plurality of segmentation test signals with swing ranges of at least two of the segmentation test signals partially overlapping.

5. The test system as claimed in claim 1, wherein the segmentation circuit comprises:
    a scaling circuit coupled to the analog signal circuit for scaling the basic test signal provided by the analog signal circuit; and
    a level superposing circuit coupled between the scaling circuit and the ADC for superposing the segmentation DC level to the scaled basic test signal and generating the segmentation test signal.

6. The test system as claimed in claim 1, wherein the segmentation circuit comprises:
    a scaling resistor network comprising two resistors; wherein the segmentation circuit determines a scaling ratio according to the two resistors such that the segmentation circuit scales the basic test signal according to the scaling ratio;
    a level adjusting resistor network comprising a variable resistor and adjusting the segmentation DC level according to resistance of the variable resistor; and
    an operation amplifier comprising two input nodes respectively coupled to the scaling resistor network and the level adjusting resistor network, and outputting the segmentation test signal.

7. A test method testing an ADC with loopback architecture, comprising:
    providing an analog basic test signal; and
    scaling an amplitude of the basic test signal and superposing it with a segmentation DC level to generate a corresponding segmentation test signal, and
    reflecting test result of the ADC according to a conversion result of the segmentation test signal performed by the ADC.

8. The test method as claimed in claim 7, wherein providing the basic test signal is performed by converting a digital input to the analog basic test signal with a DAC.

9. The test method as claimed in claim 7, wherein a plurality of different segmentation DC levels are sequentially superposed to the scaled basic test signal for providing a plurality of corresponding segmentation test signals, such that the test result of the ADC is reflected according to conversion results of the plurality of segmentation test signals performed by the ADC.

10. The test method as claimed in claim 9 further comprising:
    providing the plurality of segmentation test signals with swing ranges of at least two of the segmentation test signals partially overlapping.

* * * * *